US011178508B2

(12) United States Patent
Wootton et al.

(10) Patent No.: US 11,178,508 B2
(45) Date of Patent: *Nov. 16, 2021

(54) DETECTION NETWORK SELF-DISCOVERY

(71) Applicant: Ivani, LLC, Dardenne Prairie, MO (US)

(72) Inventors: Matthew Wootton, St. Louis, MO (US); John Wootton, St. Louis, MO (US); Chris Nissman, Tucson, AZ (US); Justin McKinney, Wildwood, MO (US); Saarth Mehrotra, Appleton, WI (US); Boris Dieseldorff, St. Charles, MO (US)

(73) Assignee: Ivani, LLC, Dardenne Prairie, MO (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/518,539

(22) Filed: Jul. 22, 2019

(65) Prior Publication Data

US 2019/0342711 A1    Nov. 7, 2019

Related U.S. Application Data

(63) Continuation of application No. 15/874,657, filed on Jan. 18, 2018, which is a continuation-in-part of (Continued)

(51) Int. Cl.
*H04W 24/00* (2009.01)
*H04W 4/02* (2018.01)
(Continued)

(52) U.S. Cl.
CPC .............. *H04W 4/023* (2013.01); *G01V 3/12* (2013.01); *G11C 11/2257* (2013.01);
(Continued)

(58) Field of Classification Search
CPC .. H04L 29/08657; H04W 4/02; H04W 64/00; H04W 4/023
See application file for complete search history.

(56) References Cited

U.S. PATENT DOCUMENTS 4,054,879 A    10/1977   Wright et al.
4,649,388 A    3/1987    Atlas
(Continued)

FOREIGN PATENT DOCUMENTS

CA    2834522 A1    5/2014
CA    2945702 A1    8/2015
(Continued)

OTHER PUBLICATIONS

International Search Report, International Patent Application No. PCT/US2015/013127, dated Apr. 24, 2015 (10 pages).
(Continued)

*Primary Examiner* — Shantell L Heiber
(74) *Attorney, Agent, or Firm* — Lewis Rice LLC

(57) ABSTRACT

Systems and methods for detecting the presence of a body in a network without fiducial elements, using signal absorption, and signal forward and reflected backscatter of radio frequency (RF) waves caused by the presence of a biological mass in a communications network.

2 Claims, 8 Drawing Sheets

Related U.S. Application Data application No. 15/674,328, filed on Aug. 10, 2017, which is a continuation-in-part of application No. 15/600,380, filed on May 19, 2017, now Pat. No. 10,064,013, which is a continuation of application No. 15/227,717, filed on Aug. 3, 2016, now Pat. No. 9,693,195, which is a continuation of application No. 15/084,002, filed on Mar. 29, 2016, now Pat. No. 9,474,042.

(60) Provisional application No. 62/252,954, filed on Nov. 9, 2015, provisional application No. 62/219,457, filed on Sep. 16, 2015.

(51) Int. Cl.

| | | |
|---|---|---|
| *G01V 3/12* | (2006.01) | |
| *H04W 4/80* | (2018.01) | |
| *H04W 4/029* | (2018.01) | |
| *H04W 4/33* | (2018.01) | |
| *H04W 4/30* | (2018.01) | |
| *H04W 64/00* | (2009.01) | |
| *H04W 4/50* | (2018.01) | |
| *H04B 17/27* | (2015.01) | |
| *H04B 17/373* | (2015.01) | |
| *G11C 11/22* | (2006.01) | |
| *H04B 17/318* | (2015.01) | |
| *H04L 1/00* | (2006.01) | |
| *H04L 5/00* | (2006.01) | |
| *G01V 1/00* | (2006.01) | |

(52) U.S. Cl.
CPC ...... *G11C 11/2259* (2013.01); *G11C 11/2273* (2013.01); *G11C 11/2293* (2013.01); *G11C 11/2297* (2013.01); *H04B 17/27* (2015.01); *H04B 17/318* (2015.01); *H04B 17/373* (2015.01); *H04L 1/0018* (2013.01); *H04L 5/006* (2013.01); *H04W 4/02* (2013.01); *H04W 4/029* (2018.02); *H04W 4/30* (2018.02); *H04W 4/33* (2018.02); *H04W 4/50* (2018.02); *H04W 4/80* (2018.02); *H04W 64/00* (2013.01); *G01V 1/001* (2013.01); *G11C 11/221* (2013.01)

(56) References Cited

U.S. PATENT DOCUMENTS

| | | |
|---|---|---|
| 4,740,045 A | 4/1988 | Goodson et al. |
| 5,270,720 A | 12/1993 | Stove |
| 5,563,455 A | 10/1996 | Cheng |
| 5,696,514 A | 12/1997 | Nathanson et al. |
| 6,075,797 A | 6/2000 | Thomas |
| 6,493,380 B1 | 12/2002 | Wu et al. |
| 6,539,483 B1 | 3/2003 | Harrison et al. |
| 6,573,861 B1 | 6/2003 | Hommel et al. |
| 6,693,536 B2 | 2/2004 | Bauer, Jr. et al. |
| 7,047,015 B2 | 5/2006 | Hawe |
| 7,295,109 B2 | 11/2007 | Kobayashi |
| 7,317,419 B2 | 1/2008 | Sugar et al. |
| 7,423,576 B2 | 9/2008 | Sahinoglu et al. |
| 7,652,617 B2 | 1/2010 | Kurtz et al. |
| 7,663,325 B2 | 2/2010 | McDonough et al. |
| 7,733,220 B2 | 6/2010 | Libby |
| 8,138,918 B2 | 3/2012 | Habib et al. |
| 8,274,386 B1 | 9/2012 | Dea et al. |
| 8,354,925 B1 | 1/2013 | Libby et al. |
| 8,402,543 B1 | 3/2013 | Ranjan et al. |
| 8,456,304 B2 | 6/2013 | van Doorn et al. |
| 8,502,666 B1 | 8/2013 | Tam et al. |
| 8,531,134 B2 | 9/2013 | Chemel et al. |
| 8,536,998 B1 | 9/2013 | Siu et al. |
| 8,552,664 B2 | 10/2013 | Chemel et al. |
| 8,555,388 B1 | 10/2013 | Wang et al. |
| 8,593,264 B2 | 11/2013 | Umezawa et al. |
| 8,624,734 B2 | 1/2014 | Inomata et al. |
| 8,682,812 B1 | 3/2014 | Ranjan |
| 8,762,298 B1 | 6/2014 | Ranjan et al. |
| 8,766,556 B2 | 7/2014 | Meyer |
| 8,793,790 B2 | 7/2014 | Khurana et al. |
| 8,818,288 B2 | 8/2014 | Patwari et al. |
| 8,836,344 B2 | 9/2014 | Habib et al. |
| 8,842,010 B2 | 9/2014 | Cehelnik |
| 8,844,038 B2 | 9/2014 | Niemela |
| 8,849,471 B2 | 9/2014 | Daniel et al. |
| 8,984,581 B2 | 3/2015 | Luna et al. |
| 9,143,413 B1 | 9/2015 | Manku et al. |
| 9,143,968 B1 | 9/2015 | Manku et al. |
| 9,144,041 B2 | 9/2015 | Curtis et al. |
| 9,185,121 B2 | 11/2015 | Chari et al. |
| 9,245,426 B2 | 1/2016 | Caicedo Fernandez et al. |
| 9,369,476 B2 | 6/2016 | Chekina et al. |
| 9,378,361 B1 | 6/2016 | Yen et al. |
| 9,407,663 B1 | 8/2016 | Pauley, Jr. et al. |
| 9,413,839 B2 | 8/2016 | Annan et al. |
| 9,474,042 B1 | 10/2016 | Wootton et al. |
| 9,523,760 B1 | 12/2016 | Kravets et al. |
| 9,524,628 B1 | 12/2016 | Omer et al. |
| 9,584,974 B1 | 2/2017 | Omer et al. |
| 9,693,195 B2 | 6/2017 | Wootton et al. |
| 9,699,713 B2 * | 7/2017 | Zhou ................. H04L 47/26 |
| 9,743,294 B1 | 8/2017 | Omer et al. |
| 9,786,138 B1 | 10/2017 | Kashyap et al. |
| 10,064,014 B2 | 8/2018 | Wootton et al. |
| 2003/0108119 A1 | 6/2003 | Mohebbi et al. |
| 2004/0080415 A1 | 4/2004 | Sorenson |
| 2004/0196140 A1 | 10/2004 | Sid |
| 2005/0055568 A1 | 3/2005 | Agrawala et al. |
| 2005/0083199 A1 | 4/2005 | Hall et al. |
| 2006/0023915 A1 * | 2/2006 | Aalbu ............... G06K 9/00228 |
| | | 382/103 |
| 2006/0037077 A1 | 2/2006 | Gadde et al. |
| 2006/0217132 A1 | 9/2006 | Drummond-Murray et al. |
| 2007/0133487 A1 | 6/2007 | Wang et al. |
| 2007/0225000 A1 | 9/2007 | Cleveland |
| 2007/0283002 A1 | 12/2007 | Bornhoevd et al. |
| 2008/0062940 A1 * | 3/2008 | Othmer ............... H04W 64/00 |
| | | 370/338 |
| 2008/0119130 A1 | 5/2008 | Sinha |
| 2008/0148398 A1 | 6/2008 | Mezack et al. |
| 2008/0214111 A1 | 9/2008 | Moshir et al. |
| 2008/0240008 A1 | 10/2008 | Backes et al. |
| 2008/0303655 A1 | 12/2008 | Johnson |
| 2008/0318564 A1 | 12/2008 | Kreiner et al. |
| 2009/0040952 A1 | 2/2009 | Cover et al. |
| 2009/0062696 A1 | 3/2009 | Nathan et al. |
| 2009/0184804 A1 | 7/2009 | Seppa |
| 2009/0256483 A1 | 10/2009 | Gehman et al. |
| 2009/0284245 A1 * | 11/2009 | Kirby ................. G06K 19/0715 |
| | | 323/318 |
| 2010/0125897 A1 | 5/2010 | Jain et al. |
| 2010/0145545 A1 | 6/2010 | Mosebrook et al. |
| 2010/0265093 A1 | 10/2010 | Cho et al. |
| 2010/0315284 A1 | 12/2010 | Trizna et al. |
| 2011/0130092 A1 | 6/2011 | Yun |
| 2011/0141647 A1 | 6/2011 | Garcia et al. |
| 2011/0153811 A1 | 6/2011 | Jeong et al. |
| 2011/0211563 A1 | 9/2011 | Herrala et al. |
| 2011/0309931 A1 | 12/2011 | Rose |
| 2012/0009882 A1 | 1/2012 | Patwari et al. |
| 2012/0046003 A1 | 2/2012 | Ying |
| 2012/0092060 A1 | 4/2012 | Ganesan |
| 2012/0115512 A1 | 5/2012 | Grainger et al. |
| 2012/0146788 A1 | 6/2012 | Wilson et al. |
| 2012/0181865 A1 | 7/2012 | Muthu |
| 2012/0184296 A1 | 7/2012 | Miloslu et al. |
| 2012/0207481 A1 | 8/2012 | Elberbaum |
| 2012/0207484 A1 | 8/2012 | Hunt |
| 2013/0090151 A1 | 4/2013 | Ngai et al. |
| 2013/0162459 A1 | 6/2013 | Aharony et al. |
| 2013/0175863 A1 | 7/2013 | Pan |

(56) References Cited

U.S. PATENT DOCUMENTS

| | | | |
|---|---|---|---|
| 2013/0260602 A1 | 10/2013 | German et al. | |
| 2013/0275574 A1* | 10/2013 | Hugard, IV | H04L 41/12 709/224 |
| 2013/0283256 A1 | 10/2013 | Proud | |
| 2014/0004874 A1 | 1/2014 | Schwartz et al. | |
| 2014/0015706 A1 | 1/2014 | Ishihara et al. | |
| 2014/0087752 A1 | 3/2014 | Zhu et al. | |
| 2014/0128778 A1 | 5/2014 | Chan et al. | |
| 2014/0135042 A1 | 5/2014 | Buchheim et al. | |
| 2014/0140231 A1 | 5/2014 | Haiut et al. | |
| 2014/0165207 A1 | 6/2014 | Engel et al. | |
| 2014/0247179 A1 | 9/2014 | Furuskog et al. | |
| 2014/0286380 A1 | 9/2014 | Prager et al. | |
| 2014/0330960 A1 | 11/2014 | Raga et al. | |
| 2014/0331272 A1 | 11/2014 | Gupta et al. | |
| 2015/0005900 A1 | 1/2015 | Steele et al. | |
| 2015/0022123 A1 | 1/2015 | Van De Sluis et al. | |
| 2015/0043377 A1 | 2/2015 | Cholas et al. | |
| 2015/0059248 A1 | 3/2015 | Iwata et al. | |
| 2015/0069242 A1 | 3/2015 | Alameh et al. | |
| 2015/0078295 A1 | 3/2015 | Mandyam et al. | |
| 2015/0098377 A1 | 4/2015 | Amini et al. | |
| 2015/0143454 A1 | 5/2015 | Lee et al. | |
| 2015/0181548 A1 | 6/2015 | Varoglu et al. | |
| 2015/0195100 A1* | 7/2015 | Imes | H04L 12/282 455/420 |
| 2015/0212205 A1 | 7/2015 | Shpater | |
| 2015/0230022 A1 | 8/2015 | Sakai et al. | |
| 2015/0245164 A1 | 8/2015 | Merrill | |
| 2015/0282081 A1 | 10/2015 | Oren | |
| 2015/0295808 A1 | 10/2015 | O'Malley et al. | |
| 2015/0301173 A1 | 10/2015 | Vangeel et al. | |
| 2015/0338507 A1 | 11/2015 | Oh et al. | |
| 2015/0348007 A1 | 12/2015 | Khan et al. | |
| 2015/0349972 A1 | 12/2015 | Deivasigamani et al. | |
| 2016/0018508 A1 | 1/2016 | Chen et al. | |
| 2016/0021485 A1* | 1/2016 | Sallas | H04W 48/14 455/41.3 |
| 2016/0028763 A1 | 1/2016 | Cruz Mota et al. | |
| 2016/0050182 A1 | 2/2016 | Edross | |
| 2016/0050224 A1 | 2/2016 | Ricafort et al. | |
| 2016/0100046 A1 | 4/2016 | Meru et al. | |
| 2016/0104365 A1 | 4/2016 | Henderson et al. | |
| 2016/0105278 A1 | 4/2016 | Huang | |
| 2016/0183059 A1 | 6/2016 | Nagy et al. | |
| 2016/0187475 A1 | 6/2016 | Horng et al. | |
| 2016/0210838 A1 | 7/2016 | Yan et al. | |
| 2016/0234167 A1 | 8/2016 | Engel et al. | |
| 2016/0241999 A1 | 8/2016 | Chin et al. | |
| 2016/0261986 A1 | 9/2016 | Nord | |
| 2016/0301543 A1 | 10/2016 | Minezawa et al. | |
| 2016/0335861 A1 | 11/2016 | Shimura | |
| 2017/0024574 A1 | 1/2017 | Agrawal et al. | |
| 2017/0134182 A1 | 5/2017 | Davis et al. | |
| 2017/0146656 A1 | 5/2017 | Belsley et al. | |
| 2017/0257744 A1 | 9/2017 | Wooton et al. | |
| 2017/0343658 A1 | 11/2017 | Ramirez et al. | |

FOREIGN PATENT DOCUMENTS

| | | |
|---|---|---|
| CN | 101184353 A | 5/2008 |
| CN | 201319687 Y | 9/2009 |
| CN | 201467534 U | 5/2010 |
| CN | 201639825 U | 11/2010 |
| CN | 201839492 U | 5/2011 |
| CN | 102131327 A | 7/2011 |
| CN | 202475882 U | 10/2012 |
| CN | 202738203 U | 2/2013 |
| CN | 202759621 U | 2/2013 |
| CN | 203241317 U | 10/2013 |
| CN | 203243557 U | 10/2013 |
| CN | 203251317 U | 10/2013 |
| EP | 1829003 B1 | 11/2013 |
| JP | 2005136532 A | 5/2005 |
| JP | 2005535950 A | 11/2005 |
| JP | 2006129098 A | 5/2006 |
| JP | 2007159370 A | 6/2007 |
| JP | 2008305800 A | 12/2008 |
| JP | 2009229318 A | 10/2009 |
| JP | 201109784 A | 6/2011 |
| JP | 2012190161 A | 10/2012 |
| JP | 2015052475 A | 3/2015 |
| JP | 2015527573 A | 9/2015 |
| JP | 2015222173 A | 12/2015 |
| JP | 2016206851 A | 12/2016 |
| KR | 100887425 B1 | 3/2009 |
| KR | 100912039 B1 | 8/2009 |
| KR | 20090113941 A | 11/2009 |
| KR | 101009613 B1 | 1/2011 |
| KR | 20130012996 A | 2/2013 |
| KR | 20130017298 A | 2/2013 |
| KR | 20140080755 A | 7/2014 |
| KR | 20140120748 A | 10/2014 |
| WO | 2011062445 A2 | 5/2011 |
| WO | 2012010170 A1 | 1/2012 |
| WO | 2014021574 A1 | 2/2014 |
| WO | 2014026226 A1 | 2/2014 |
| WO | 2014109486 A1 | 7/2014 |
| WO | 2014201574 A1 | 12/2014 |
| WO | 2015035830 A1 | 3/2015 |
| WO | 2015168700 A1 | 11/2015 |
| WO | 2017078811 A2 | 5/2017 |

OTHER PUBLICATIONS

International Search Report, International Patent Application No. PCT/US2015/058019, dated Feb. 5, 2016 (10 pages).

International Search Report, International Patent Application No. PCT/US2015/057869, dated Feb. 5, 2016 (10 pages).

International Search Report, International Patent Application No. PCT/US2016/016836, dated May 24, 2016 (12 pages).

International Search Report, International Patent Application No. PCT/US2016/045611, dated May 16, 2017, (10 pages).

International Search Report, International Patent Application No. PCT/US2018/047555, dated Nov. 13, 2018 (10 pages).

International Search Report, International Patent Application No. PCT/US2018/045835, dated Nov. 20, 2018 (21 pages).

International Search Report, International Patent Application No. PCT/US2019/014197, dated May 8, 2019 (13 pages).

Youssef, Moustafa, et al., "Challenges: Device-free Passive Localization for Wireless Environments", Mobicom 2007 Proceedings of the 13th Annual ACM International Conference on Mobile Computing and Networking, held on Sep. 9-14, 2007, in Montreal, Quebec, Canada, pp. 222-229 (8 pages).

Adib, Fadel et al., "See Through Walls with Wi-Fi!", ACM SIGCOMM Computer Communication Review, Oct. 2013, vol. 43, Issue 4, pp. 75-86 (12 pages).

Netgear®, "N600 WiFi Cable Modem Router, Model C3700 User Manual", dated Mar. 2014 (101 pages).

OpenWRT, "Wireless Configuration", https://web.archive.org/web/20140402033233/http://wiki.openwrt.org/doc/uci/wireless (capture of URL http://wiki.openwrt.org/doc/uci/wireless on Apr. 2, 2014), printed on Jan. 25, 2018 (10 pages).

Wikipedia; "Baseband processor", rhttps://en.wikipedia.org/wiki/Bandband_processor; 2 pages; version dated Apr. 19, 2016, printed on Jan. 25, 2018 (1 page).

quora.com; "What is the function of the baseband processor in wireless devices?"; https://www.quora.com/What-is-the-function-of-the-baseband-processor-in-wireless-devices; May 15, 2016, printed on Jan. 25, 2018 (2 pages).

Ceva; Ceva's DSP Cores Power the World's Leading Mobile Broadband and M2M Applications; http://www.ceva-dsp.com/Mobile-Broadband; May 15, 2016, printed on Jan. 28, 2018 (3 pages).

Apple Insider; "Intel to reportedly supply LTE chips for 2016 iPhone"; http://appleinsider.com/articles/15/03/11/intel-to-reportedly-supply-lte-chips-for-2016-iphone, printed on Jan. 25, 2018 (9 pages).

Japan Radio Co., Ltd; "26GHz FWA—Technology"; http://www.jrc.co.jp/eng/product/lineup/26ghz_wireless_ip_access_system/tech.html, printed on Jan. 25, 2018 (3 pages).

* cited by examiner

DETECTION NETWORK SELF-DISCOVERY

CROSS-REFERENCE TO RELATED APPLICATIONS

This application is Continuation of U.S. Utility patent application Ser. No. 15/874,657, filed Jan. 18, 2018, which is a Continuation-In-Part of U.S. Utility patent application Ser. No. 15/674,328, filed Aug. 10, 2017, which is a Continuation-In-Part of U.S. Utility patent application Ser. No. 15/600,380, filed May 19, 2017, which is a Continuation of U.S. Utility patent application Ser. No. 15/227,717, filed Aug. 3, 2016, and issued on Jun. 27, 2017, as U.S. Pat. No. 9,693,195, which claims the benefit of U.S. Provisional Patent Application No. 62/252,954, filed Nov. 9, 2015, and U.S. Provisional Patent Application No. 62/219,457, filed Sep. 16, 2015 and which is a continuation of U.S. Utility patent application Ser. No. 15/084,002, filed Mar. 29, 2016, and issued on Oct. 18, 2016, as U.S. Pat. No. 9,474,042, which application in turn also claims benefit of U.S. Provisional Patent Application No. 62/252,954, filed Nov. 9, 2015, and U.S. Provisional Patent Application No. 62/219,457, filed Sep. 16, 2015. The entire disclosure of all of these documents is herein incorporated by reference.

BACKGROUND

1. Field of the Invention

This disclosure is related to the field of object detection, and more particularly to systems and methods for detecting the presence of a biological mass within a wireless communications network.

2. Description of the Related Art

Tracking objects may be done using a number of techniques. For example, a moving transceiver may be attached to the object. Examples of such systems include global positioning location systems such as GPS, which use orbiting satellites to communicate with terrestrial transceivers. However, such systems are generally less effective indoors, where satellite signals may be blocked, reducing accuracy. Thus, other technologies are often used indoors, such as Bluetooth™ beacons, which calculate the location of a roaming or unknown transceiver. The roaming transceiver acts as a fiducial element.

These systems have several disadvantages, among them that the object tracked must include a transceiver. In certain applications, the object to be tracked will have no such fiducial element, or will actively disable any such element, such as an intruder in a home.

Other technologies exist which can also detect and track objects without the use of a fiducial element. For example, radar is a venerable object-detection system that uses RF waves to determine the range, angle, or velocity of objects, including aircraft, ships, spacecraft, guided missiles, motor vehicles, weather formations, and terrain. Radar operates by transmitting electromagnetic waves, generally using waves in the radio frequency ("RF") of the electromagnetic spectrum, which reflect from any object in their path. A receiver, typically part of the same system as the transmitter, receives and processes these reflected waves to determine properties of the objects. Other systems similar to radar, using other parts of the electromagnetic spectrum, may also be used in similar fashion, such as ultraviolet, visible, or near-infrared light from lasers.

Radar technologies do not require a fiducial element, but have other shortcomings. For example, radar signals are susceptible to signal noise, or random variations in the signal caused by internal electrical components, as well as noise and interference from external sources, such as the natural background radiation. Radar is also vulnerable to external interference sources, such as intervening objects blocking the beam path and can be deceived by objects of particular size, shape, and orientation.

In addition, the growth of home automation technologies has provided a wealth of additional interaction vectors for "Internet of Things" ("IoT") devices, including voice recognition for voice-based control. This technology has been proliferated by various commercial enterprises such as Amazon (Alexa), Google (Google Home), Apple (Siri), and Microsoft (Cortana). These voice recognition systems are currently used with IOT devices to provide users with the ability to provide spoken word input to IOT devices, instructing them to perform certain functions. Currently, this interaction is typically one-directional, with the voice control system sending commands to the IoT device and receiving status updates from those devices when queried by the voice control system. The market lacks third-party systems which trigger voice recognition systems, such as to prompt a response.

SUMMARY

The following is a summary of the invention in order to provide a basic understanding of some aspects of the invention. This summary is not intended to identify key or critical elements of the invention or to delineate the scope of the invention. The sole purpose of this section is to present some concepts of the invention in a simplified form as a prelude to the more detailed description that is presented later.

Because of these and other problems in the art, there is described herein, among other things, is a method for detecting the presence of a human comprising: providing a first transceiver disposed at a first position within a detection area; providing a second transceiver disposed at a second location within the detection area; a computer server communicably coupled to the first transceiver; the first transceiver receiving a first set of wireless signals from the second transceiver via the wireless communications network; the computer server receiving a first set of signal data from the first transceiver, the first set of signal data comprising data about the properties of the first set of wireless signals, the property data being generated as part of ordinary operation of the first transceiver on the communication network; the computer server creating a baseline signal profile for communications from the second transceiver to the first transceiver, the baseline signal profile being based at least in part on the wireless signal properties in the received first set of signal data, and representing characteristics of wireless transmissions from the second transceiver to the first transceiver when no human is present in the detection area; the first transceiver receiving a second set of wireless signals from the second transceiver via the wireless communications network; the computer server receiving a second set of signal data from the first transceiver, the second set of signal data comprising data about the properties of the second set of wireless signals, the property data being generated as part of ordinary operation of the first transceiver on the communication network; and the computer server determining whether a human is present within the detection area, the determination based at least in part on a comparison of the wireless signal properties in the received second set of wireless signal data to the baseline signal profile.

In an embodiment of the method, the first set of signal properties comprise wireless network signal protocol properties determined by the first transceiver.

In another embodiment of the method, the wireless network signal protocol properties are selected from the group consisting of: received signal strength, latency, and bit error rate.

In another embodiment of the method, the method further comprises: providing a third transceiver disposed at a third location within the detection area; the first transceiver receiving a third set of wireless signals from the third transceiver via the wireless communications network; the computer server receiving a third set of signal data from the first transceiver, the third set of signal data comprising data about the properties of the third set of wireless signals, the property data being generated as part of ordinary operation of the first transceiver on the communication network; the computer server creating a second baseline signal profile for communications from the third transceiver to the first transceiver, the second baseline signal profile being based at least in part on the wireless signal properties in the received third set of signal data, and representing characteristics of wireless transmissions from the third transceiver to the first transceiver when no human is present in the detection area; the first transceiver receiving a fourth set of wireless signals from the third transceiver via the wireless communications network; the computer server receiving a fourth set of signal data from the first transceiver, the fourth set of signal data comprising data about the properties of the fourth set of wireless signals, the property data being generated as part of ordinary operation of the first transceiver on the communication network; and in the determining step, the computer server determining whether a human is present within the detection area based at least in part on a comparison of the wireless signal properties in the received fourth set of wireless signal data to the second baseline signal profile.

In another embodiment of the method, the determining step applies statistical methods to the second set of wireless signal data to determine the presence of a human.

In another embodiment of the method, the method further comprises: the computer server continuously determining the presence or absence of a human within the detection area, the determination based at least in part on a comparison of the baseline signal profile to signal data comprising data about the properties of the first set of wireless signals received continuously at the computer server from the first transceiver; and the computer continuously updating the baseline signal profile based on the continuously received signal data when the continuously received signal data indicates the absence of a human in the detection area.

In another embodiment of the method, the method further comprises: the computer server determining the number of humans present within the detection area, the determination based at least in part on a comparison of the received second set of signal properties to the baseline signal profile.

In another embodiment of the method, the method further comprises: the computer server determining the location of one or more humans within the detection area, the determination based at least in part on a comparison of the received second set of signal properties to the baseline signal profile.

In another embodiment of the method, the method further comprises: the computer server being operatively coupled to a second system; and only after the computer server detects the presence of a human in the detection area, the computer operates the second system.

In another embodiment of the method, the detection network and the second system are configured to communicate using the same communication protocol.

In another embodiment of the method, the second system is an electrical system.

In another embodiment of the method, the second system is a lighting system.

In another embodiment of the method, the second system is a heating, venting, and cooling (HVAC) system.

In another embodiment of the method, the second system is a security system.

In another embodiment of the method, the second system is an industrial automation system.

In another embodiment of the method, the wireless communication protocol is selected from the group consisting of: Bluetooth™, Bluetooth™ Low Energy, ANT, ANT+, WiFi, Zigbee, Thread, and Z-Wave.

In another embodiment of the method, the wireless communication network has a carrier frequency in the range of 850 MHz and 17.5 GHz inclusive.

In another embodiment of the method, the determination whether a human is present within the detection area is adjusted based on machine learning comprising: determining a first sample location of a human having a fiducial element in the detection area, the first sample location being determined based upon detecting the fiducial element; determining a second sample location of the human in the detection area, the second sample location being determined based at least in part on a comparison of the received second set of signal data to the baseline signal profile not utilizing the fiducial element; comparing the first sample location and the second sample location; and adjusting the determination step based on non-fiducial element location to improve the location calculating capabilities of the system, the adjusting based upon the comparing step.

In another embodiment of the method, the determination whether a human is present within the detection area is adjusted based on machine learning comprising: determining based on user input or action that a human was present in an area when the sample signal properties correspond at least in part with baseline signal properties of an empty space, modifying, at least in part, the baseline signal properties for an empty space; modifying, at least in part, the signal properties associated with an occupied space; and adjusting the method for comparing sample signal properties to the baseline and other comparative signal properties to improve the accuracy of the system over time.

In an embodiment of the system, the user input or action which provides presence data is provided directly to the system in some form including, but not limited to, physical switches, smartphone input, or auditory cues.

In an embodiment of the system, the user input or action which provides presence data is provided indirectly to the system in some form, such as deliberately changing the signal profile to counteract a decision being taken by the system, such as providing such a change during a dimming phase in a lighting system.

In another embodiment of the method, the method further comprises: the computer server storing a plurality of historical data records indicative of whether a human was present in the detection area over a period of time, each of the historical data records comprising an indication of the number of humans detected in the detected area and the date and time of when the number of humans was detected in the detection area; and the computer server making the historical data records available to one or more external computer systems via an interface.

Also described herein, among other things, is a method for detecting the presence of a human comprising: providing a first transceiver disposed at a first position within a detection area; providing a second transceiver disposed at a second location within the detection area; providing a computer server communicably coupled to the first transceiver; providing a first external system operatively coupled to the computer server; providing a second external system operatively coupled to the computer server; the computer server receiving from the first transceiver a set of baseline signal data comprising property data about the signal properties of a first set of wireless signals received by the first transceiver from the second transceiver when no human is present in the detection area, the property data being generated by the first transceiver as part of ordinary operation of the first transceiver on the communication network; the computer server creating a baseline signal profile for communications from the second transceiver to the first transceiver when no human is present in the detection area, the baseline signal profile being based at least in part on the property data representing characteristics of wireless transmissions from the second transceiver to the first transceiver when no human is present in the detection area; the computer server receiving from the first transceiver a first set of sample baseline signal data comprising property data about the signal properties of a second set of wireless signals received by the first transceiver from the second transceiver when a human is present in the detection area, the property data being generated by the first transceiver as part of ordinary operation of the first transceiver on the communication network; the computer server creating a first sample baseline signal profile for communications from the second transceiver to the first transceiver when a human is present in the detection area, the first sample baseline signal profile being based at least in part on the property data in the first set of sample baseline signal data, representing characteristics of wireless transmissions from the second transceiver to the first transceiver when a human is present in the detection area; the computer server receiving from the first transceiver a second set of sample baseline signal data comprising property data about the signal properties of a third set of wireless signals received by the first transceiver from the second transceiver when a human is present in the detection area, the property data being generated by the first transceiver as part of ordinary operation of the first transceiver on the communication network; the computer server creating a second sample baseline signal profile for communications from the second transceiver to the first transceiver when a human is present in the detection area, the second sample baseline signal profile being based at least in part on the property data in the second set of sample baseline signal data, representing characteristics of wireless transmissions from the second transceiver to the first transceiver when a human is present in the detection area; the computer server receiving from the first transceiver a third set of sample baseline signal data comprising property data about the signal properties of a fourth set of wireless signals received by the first transceiver from the second transceiver when a human is present in the detection area, the property data being generated by the first transceiver as part of ordinary operation of the first transceiver on the communication network; the computer server determining to operate the first external system based upon the computer server determining that the property data in the third set of sample baseline signal data corresponds to the first sample baseline signal profile; the computer server determining not to operate the second external system based upon the computer server determining that the property data in the third set of sample baseline signal data does not correspond to the second sample baseline signal profile.

In an embodiment of the method, the determination to operate the first external system and the determination not to operate the second external system is adjusted based on machine learning comprising: determining a first sample location of a human having a fiducial element in the detection area, the first sample location being determined based upon detecting the fiducial element; determining a second sample location of the human in the detection area, the second sample location being determined based at least in part on a comparison of the received second set of signal data to the baseline signal profile not utilizing the fiducial element; comparing the first sample location and the second sample location; and adjusting the determination steps based on non-fiducial element location to improve the location calculating capabilities of the system, the adjusting based upon the comparing step.

In another embodiment of the method, the determination to operate the first external system and the determination not to operate the second external system is adjusted based on machine learning comprising: determining a first sample location of a human in the detection area using inference, the first sample location being determined based upon detecting the human interacting with the system in some known way; determining a second sample location of the human in the detection area, the second sample location being determined based at least in part on a comparison of the received second set of signal data to the baseline signal profile not utilizing the inferred location; comparing the first sample location and the second sample location; and adjusting the determination steps based on inferred location to improve the location calculating capabilities of the system, the adjusting based upon the comparing step.

In another embodiment of the method, the property data about the wireless signals comprises data about signal properties selected from the group consisting of: received signal strength, latency, and bit error rate.

In another embodiment of the method, the computer server creates the first sample baseline signal profile by applying statistical methods to the first set of sample baseline signal data, and the computer server creates the second sample baseline signal profile by applying statistical methods to the second set of sample baseline signal data.

In another embodiment of the method, the method further comprises: the computer server receiving from the first transceiver additional sets of baseline signal data comprising property data about the signal properties of a second set of wireless signals received by the first transceiver from the second transceiver, the property data being generated by the first transceiver as part of ordinary operation of the first transceiver on the communication network and the computer server updating the baseline signal profile based on the continuously received additional sets of baseline signal data when the continuously received sets of baseline signal data indicate the absence of a human in the detection area.

In another embodiment of the method, the method further comprises: the computer server receiving from the first transceiver a set of signal data comprising property data about the signal properties of a second set of wireless signals received by the first transceiver from the second transceiver when one or more humans are present in the detection area, the property data being generated by the first transceiver as part of ordinary operation of the first transceiver on the communication network; the computer server determining the quantity of humans present in the detection area based at least in part on a comparison of the set of signal data to the baseline signal profile.

In another embodiment of the method, the method further comprises: the computer server determining a location of each of the one or more humans present in the detection area, the determination based at least in part on a comparison of the set of signal data to the baseline signal profile.

In another embodiment of the method, when a human is present in the detection area, the computer server determines that a human is present in the detection area and operates the first external system even if the property data in the third set of sample baseline signal data corresponds to the second sample baseline signal profile.

In another embodiment of the method, when a human is present in the detection area, the computer server determines that a human is present in the detection area and operates the second external system only if the property data in the third set of sample baseline signal data corresponds to the second sample baseline signal profile.

In another embodiment of the method, the wireless communication network has a carrier frequency in the range of 850 MHz and 17.5 GHz inclusive.

In another embodiment of the method, the method further comprises: the computer server storing a plurality of historical data records indicative of whether a human was present in the detection area over a period of time, each of the historical data records comprising an indication of the number of humans detected in the detected area and the date and time of when the number of humans was detected in the detection area; and the computer server making the historical data records available to one or more external computer systems via an interface.

Figure 1:
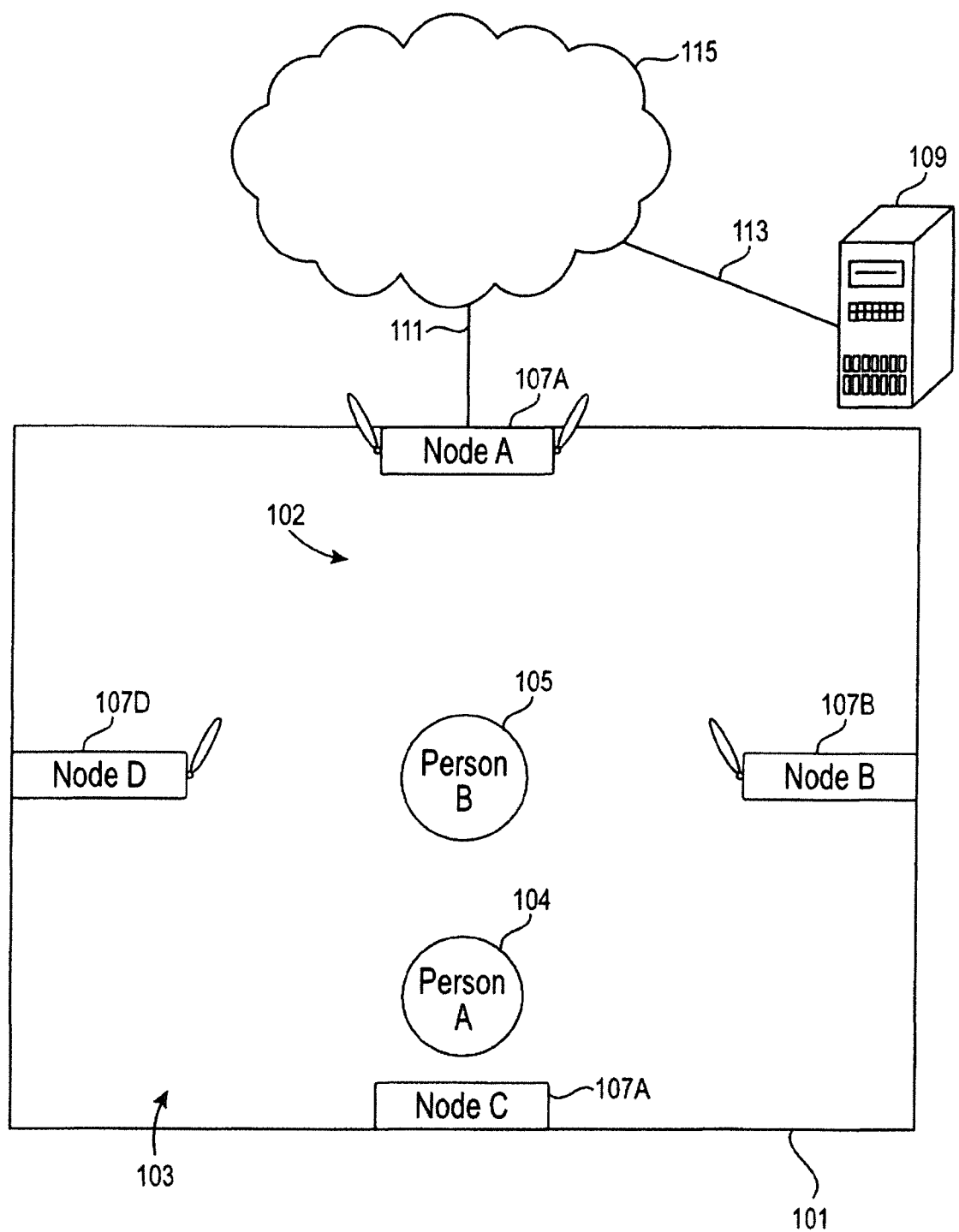
FIG. 1 is a schematic diagram of an embodiment of a system according to the present disclosure.

DESCRIPTION OF THE PREFERRED
EMBODIMENT(S)

The following detailed description and disclosure illustrates by way of example and not by way of limitation. This description will clearly enable one skilled in the art to make and use the disclosed systems and methods, and describes several embodiments, adaptations, variations, alternatives and uses of the disclosed systems and methods. As various changes could be made in the above constructions without departing from the scope of the disclosures, it is intended that all matters contained in the description or shown in the accompanying drawings shall be interpreted as illustrative and not in a limiting sense.

Generally speaking, described herein, among other things, are systems and methods for detecting the presence of a body in a network without fiducial elements. Generally speaking, the systems and methods described herein use signal absorption, and signal forward scatter and reflected backscatter of the RF communication caused by the presence of a biological mass in a communications network, generally a mesh network. Additionally, this disclosure describes various systems and methods for integrating such presence sensing technology with other systems, such as electrical, security, and industrial automation systems.

Throughout this disclosure, the term "computer" describes hardware which generally implements functionality provided by digital computing technology, particularly computing functionality associated with microprocessors. The term "computer" is not intended to be limited to any specific type of computing device, but it is intended to be inclusive of all computational devices including, but not limited to: processing devices, microprocessors, personal computers, desktop computers, laptop computers, workstations, terminals, servers, clients, portable computers, handheld computers, smart phones, tablet computers, mobile devices, server farms, hardware appliances, minicomputers, mainframe computers, video game consoles, handheld video game products, and wearable computing devices including but not limited to eyewear, wrist-wear, pendants, and clip-on devices.

As used herein, a "computer" is necessarily an abstraction of the functionality provided by a single computer device outfitted with the hardware and accessories typical of computers in a particular role. By way of example and not limitation, the term "computer" in reference to a laptop computer would be understood by one of ordinary skill in the art to include the functionality provided by pointer-based input devices, such as a mouse or track pad, whereas the term "computer" used in reference to an enterprise-class server would be understood by one of ordinary skill in the art to include the functionality provided by redundant systems, such as RAID drives and dual power supplies.

It is also well known to those of ordinary skill in the art that the functionality of a single computer may be distributed across a number of individual machines. This distribution may be functional, as where specific machines perform specific tasks; or, balanced, as where each machine is capable of performing most or all functions of any other machine and is assigned tasks based on its available resources at a point in time. Thus, the term "computer" as used herein, can refer to a single, standalone, self-contained device or to a plurality of machines working together or independently, including without limitation: a network server farm, "cloud" computing system, software-as-a-service, or other distributed or collaborative computer networks.

Those of ordinary skill in the art also appreciate that some devices which are not conventionally thought of as "computers" nevertheless exhibit the characteristics of a "computer" in certain contexts. Where such a device is performing the functions of a "computer" as described herein, the term "computer" includes such devices to that extent.

Devices of this type include but are not limited to: network hardware, print servers, file servers, NAS and SAN, load balancers, and any other hardware capable of interacting with the systems and methods described herein in the matter of a conventional "computer."

Throughout this disclosure, the term "software" refers to code objects, program logic, command structures, data structures and definitions, source code, executable and/or binary files, machine code, object code, compiled libraries, implementations, algorithms, libraries, or any instruction or set of instructions capable of being executed by a computer processor, or capable of being converted into a form capable of being executed by a computer processor, including without limitation virtual processors, or by the use of run-time environments, virtual machines, and/or interpreters. Those of ordinary skill in the art recognize that software can be wired or embedded into hardware, including without limitation onto a microchip, and still be considered "software" within the meaning of this disclosure. For purposes of this disclosure, software includes without limitation: instructions stored or storable in RAM, ROM, flash memory BIOS, CMOS, mother and daughter board circuitry, hardware controllers, USB controllers or hosts, peripheral devices and controllers, video cards, audio controllers, network cards, Bluetooth™ and other wireless communication devices, virtual memory, storage devices and associated controllers, firmware, and device drivers. The systems and methods described herein are contemplated to use computers and computer software typically stored in a computer- or machine-readable storage medium or memory.

Throughout this disclosure, terms used herein to describe or reference media-holding software, including without limitation terms such as "media," "storage media," and "memory," may include or exclude transitory media such as signals and carrier waves.

Throughout this disclosure, the term "network" generally refers to a voice, data, or other telecommunications network over which computers communicate with each other. The term "server" generally refers to a computer providing a service over a network, and a "client" generally refers to a computer accessing or using a service provided by a server over a network. Those having ordinary skill in the art will appreciate that the terms "server" and "client" may refer to hardware, software, and/or a combination of hardware and software, depending on context. Those having ordinary skill in the art will further appreciate that the terms "server" and "client" may refer to endpoints of a network communication or network connection, including but not necessarily limited to a network socket connection. Those having ordinary skill in the art will further appreciate that a "server" may comprise a plurality of software and/or hardware servers delivering a service or set of services. Those having ordinary skill in the art will further appreciate that the term "host" may, in noun form, refer to an endpoint of a network communication or network (e.g., "a remote host"), or may, in verb form, refer to a server providing a service over a network ("hosts a website"), or an access point for a service over a network.

Throughout this disclosure, the term "real time" refers to software operating within operational deadlines for a given event to commence or complete, or for a given module, software, or system to respond, and generally invokes that the response or performance time is, in ordinary user perception and considered the technological context, effectively generally contemporaneous with a reference event. Those of ordinary skill in the art understand that "real time" does not literally mean the system processes input and/or responds instantaneously, but rather that the system processes and/or responds rapidly enough that the processing or response time is within the general human perception of the passage of real time in the operational context of the program. Those of ordinary skill in the art understand that, where the operational context is a graphical user interface, "real time" normally implies a response time of no more than one second of actual time, with milliseconds or microseconds being preferable. However, those of ordinary skill in the art also understand that, under other operational contexts, a system operating in "real time" may exhibit delays longer than one second, particularly where network operations are involved.

Throughout this disclosure, the term "transmitter" refers to equipment, or a set of equipment, having the hardware, circuitry, and/or software to generate and transmit electromagnetic waves carrying messages, signals, data, or other information. A transmitter may also comprise the componentry to receive electric signals containing such messages, signals, data, or other information, and convert them to such electromagnetic waves. The term "receiver" refers to equipment, or a set of equipment, having the hardware, circuitry, and/or software to receive such transmitted electromagnetic waves and convert them into signals, usually electrical, from which the message, signal, data, or other information may be extracted. The term "transceiver" generally refers to a device or system that comprises both a transmitter and receiver, such as, but not necessarily limited to, a two-way radio, or wireless networking router or access point. For purposes of this disclosure, all three terms should be understood as interchangeable unless otherwise indicated; for example, the term "transmitter" should be understood to imply the presence of a receiver, and the term "receiver" should be understood to imply the presence of a transmitter.

Throughout this disclosure, the term "detection network" refers to a wireless network used in the systems and methods of the present disclosure to detect the presence of biological mass interposed within the communications area of the network. A detection network may use general networking protocols and standards and may be, but is not necessarily, a special-purpose network. That is, while the nodes in the network could be deployed for the specific purpose of setting up a wireless detection network according to the present invention, they need not be and generally will not be. Ordinary wireless networks established for other purposes may be used to implement the systems and methods described herein. In the preferred embodiment, the detection network uses a plurality of Bluetooth™ Low Energy nodes, but the present disclosure is not limited to such nodes. Each node acts as a computer with an appropriate transmitter and receiver for communicating over the network. Each of the computers provides a unique identifier within the network whenever transmitting a message such that a receiving computer is capable of discerning from where the message originated. Such message origination information will usually be critical to the functioning of the invention as described in this detailed description. The receiving computer then analyzes the incoming signal properties, including but not limited to, signal strength, bit error rate, and message delay. The detection network may be a mesh network, which means a network topology in which each node relays data from the network.

Throughout this disclosure, the term "node" refers to a start point or endpoint for a network communication, generally a device having a wireless transceiver and being a part of a detection network. Nodes are generally standalone, self-contained networking devices, such as wireless routers, wireless access points, short-range beacons, and so forth. A node may be a general-purpose device or a special-purpose device configured for use in a detection network as described herein. By way of example and not limitation, a node may be a device having the wireless transmission capabilities of an off-the-shelf wireless networking device with the addition of specialized hardware, circuitry, componentry, or programming for implementing the systems and methods described herein; that is, for detecting significant changes to signal properties, including but not limited to, signal strength, bit error rate, and message delay. Within a detection network, each node can act as both a transmitter of signal to the network, as well as a receiver for other nodes to push information. In the preferred embodiment, the nodes utilize Bluetooth™ Low Energy (BLE) as a wireless networking system.

Throughout this disclosure, the term "continuous" refers to something happening at an ongoing basis over time, whether such events are mathematically continuous or discontinuous. The generally accepted mathematical definition of "continuous function" describes a function which is without holes or jumps, generally described by two-sided limits. The technology described herein is based upon disturbances to a telecommunications system, in which the transceivers transmit at discrete intervals, and the received raw data is taken discretely, i.e. at discrete time intervals. The resulting data in itself may be discrete in that it captures the characteristic of the system during a particular observation window (i.e., the time interval). In a physical or mathematical sense, this mechanism is essentially a set of discrete data points in time, implying a discontinuous function. However, in the context of the technology, one of ordinary skill in the art would understand a system exhibiting this type of behavior to be "continuous" given that such measurements are taken at an ongoing basis over time.

Figure 2:
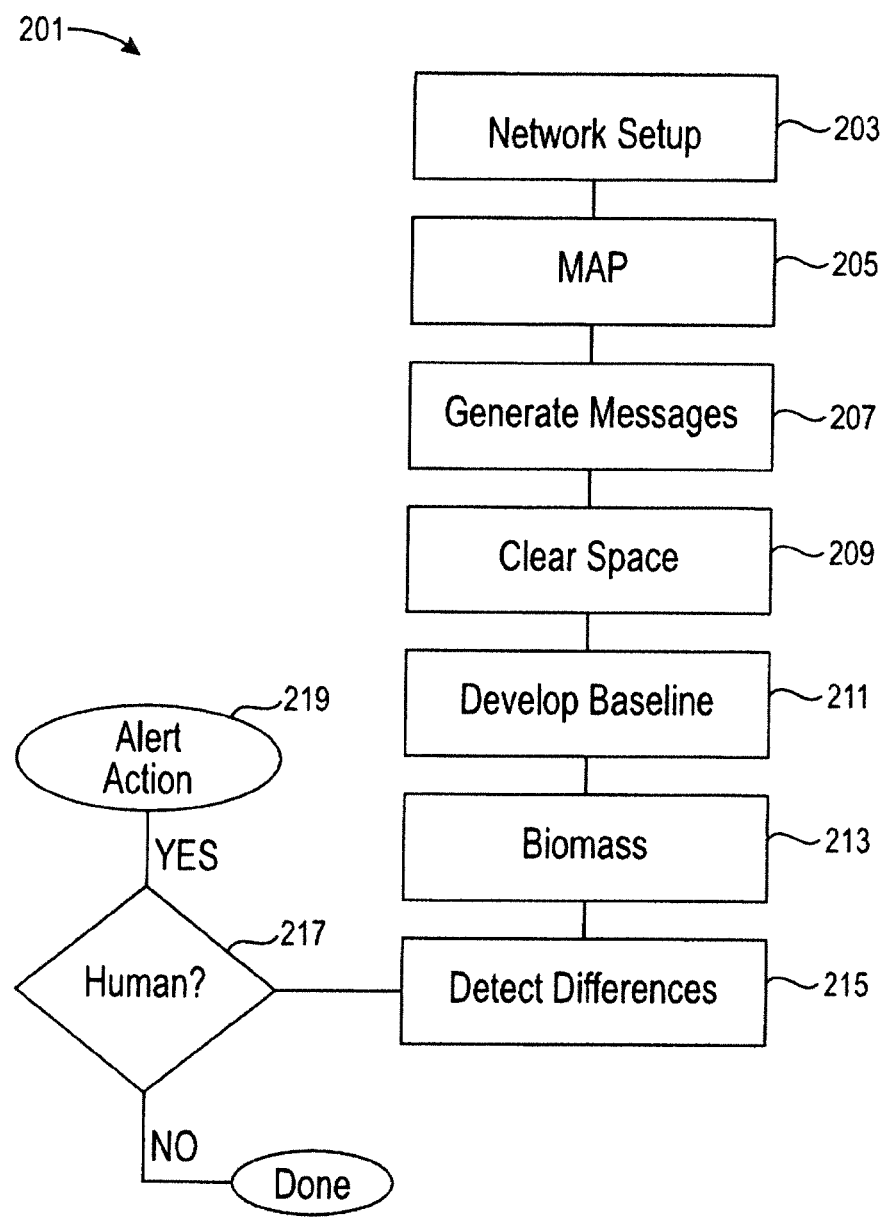
FIG. 2 is a flowchart of an embodiment of a method according to the present disclosure.
Figure 3A:
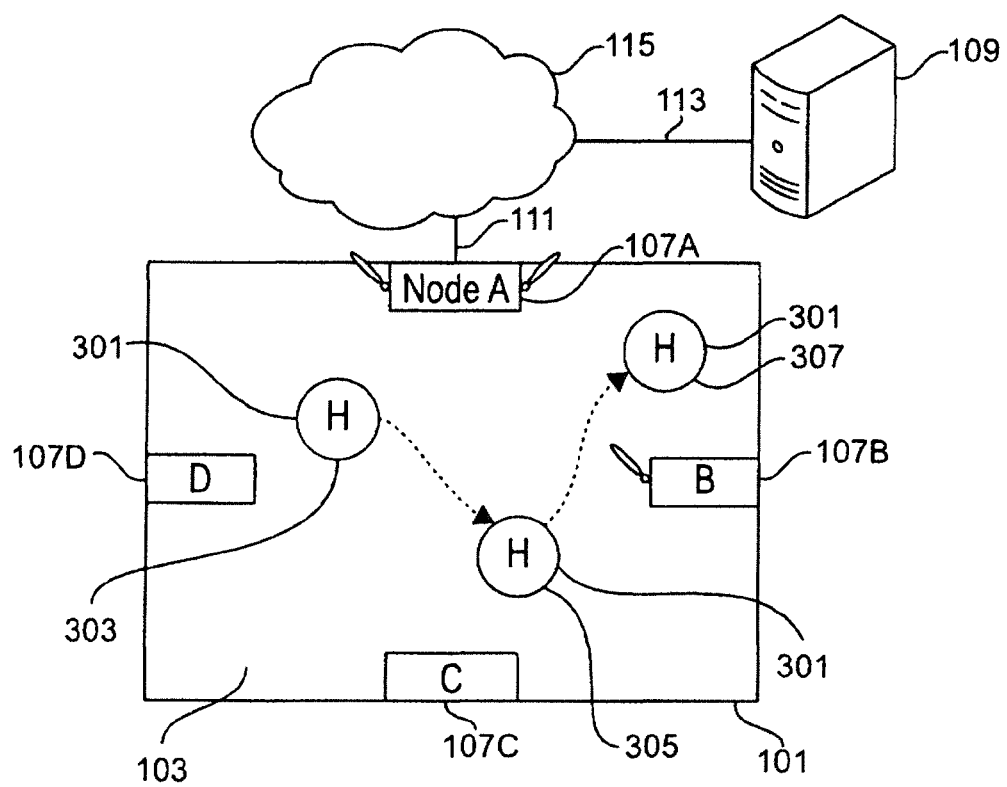
FIG. 3A depicts a schematic diagram of a system for change detection in a detection network over time according to the present disclosure.
Figure 3B:
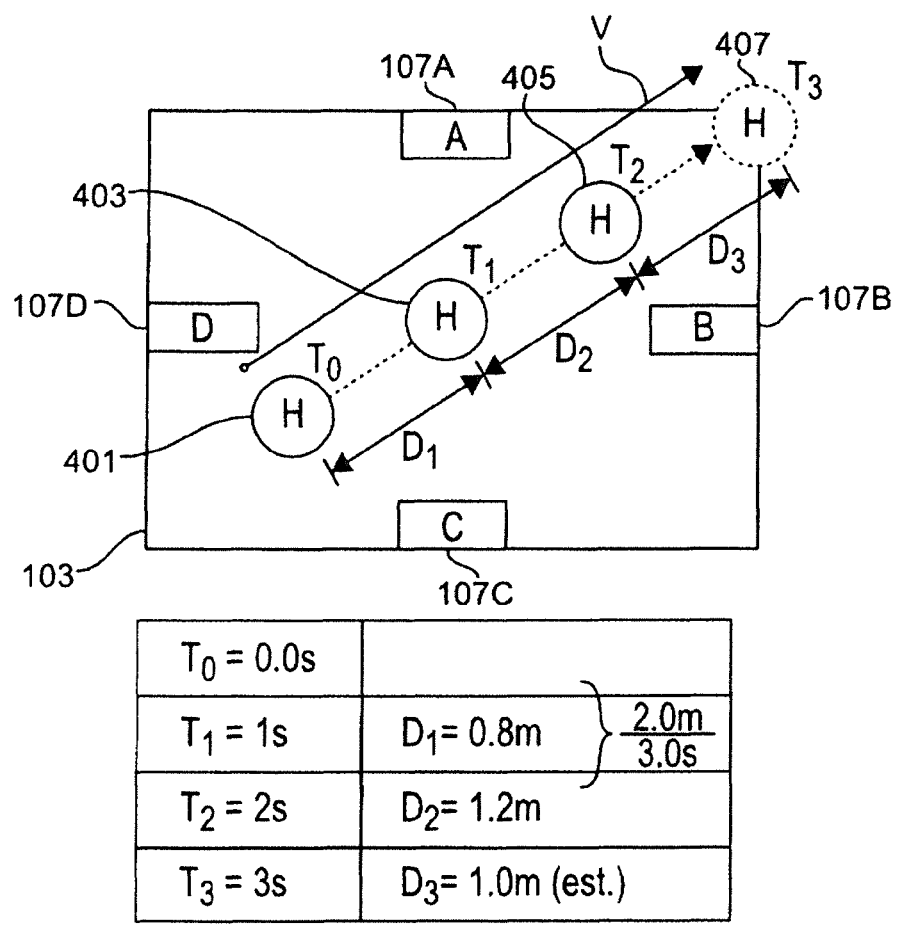
FIG. 3B depicts a schematic diagram of a system for detecting changes in locations of humans in a detection network over time according to the present disclosure.

This application should be understood with respect to the systems and methods for detecting the presence of a human within a detection network, or "Network Presence Sensing" (NPS) described in U.S. Utility patent application Ser. No. 15/674,328, filed Aug. 10, 2017, U.S. Utility patent application Ser. No. 15/600,380, filed May 19, 2017, U.S. Pat. Nos. 9,693,195, 9,474,042, U.S. Provisional Patent Application No. 62/252,954, filed Nov. 9, 2015, and U.S. Provisional Patent Application No. 62/219,457, filed Sep. 16, 2015. This disclosures of all of these documents are incorporated herein by reference. Various aspects of these disclosures are discussed herein, including NPS, which is, at a high level, the inference of the presence of humans within a detection network based on changes in the characteristics of wireless network signals caused by the absorption of wireless waves caused by the water mass of the human body within the detection network. FIG. 1 is a schematic diagram of a system and method for NPS according to the above references. FIG. 2 depicts an embodiment (201) of a method for NPS according to the above references. FIGS. 3A and 3B depict embodiments of NPS using change detection according to the above references.

The present disclosure is directed to systems and methods for recognizing and including devices in a detection network on an ad hoc basis. This has the effect of such devices being part of both an independent primary function network (e.g., the network functions for which the device is configured for use according to its intended purpose), as well as part of a secondary function network (meaning a detection network implementing NPS technology). The present systems and methods facilitate a plurality of unrelated devices from different manufacturers, and having different primary functions, cooperating in a secondary function network in which they can share functionality.

Figure 4:
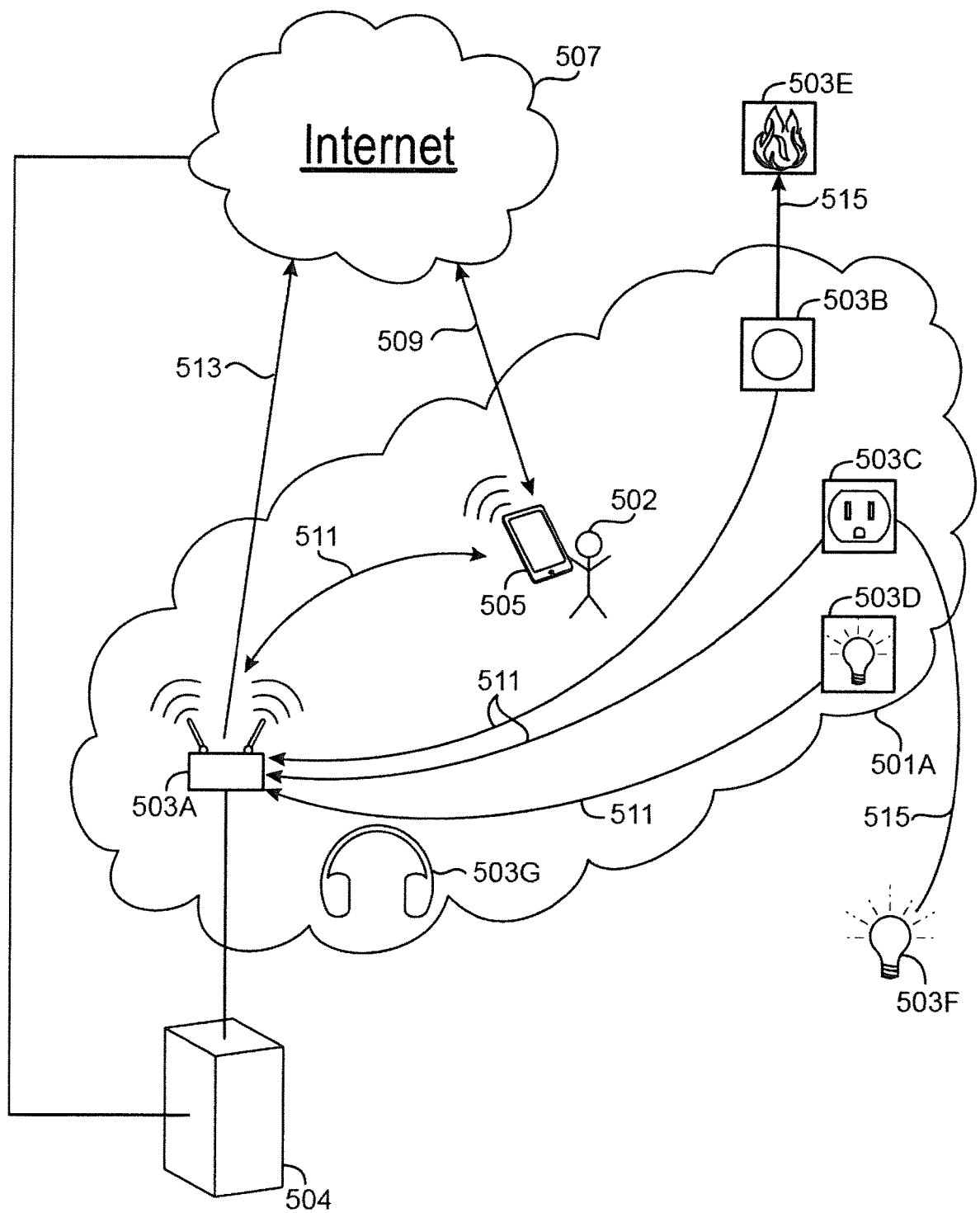
FIG. 4 depicts a schematic diagram of a system for forming an ad hoc network according to the present disclosure.
Figure 5:
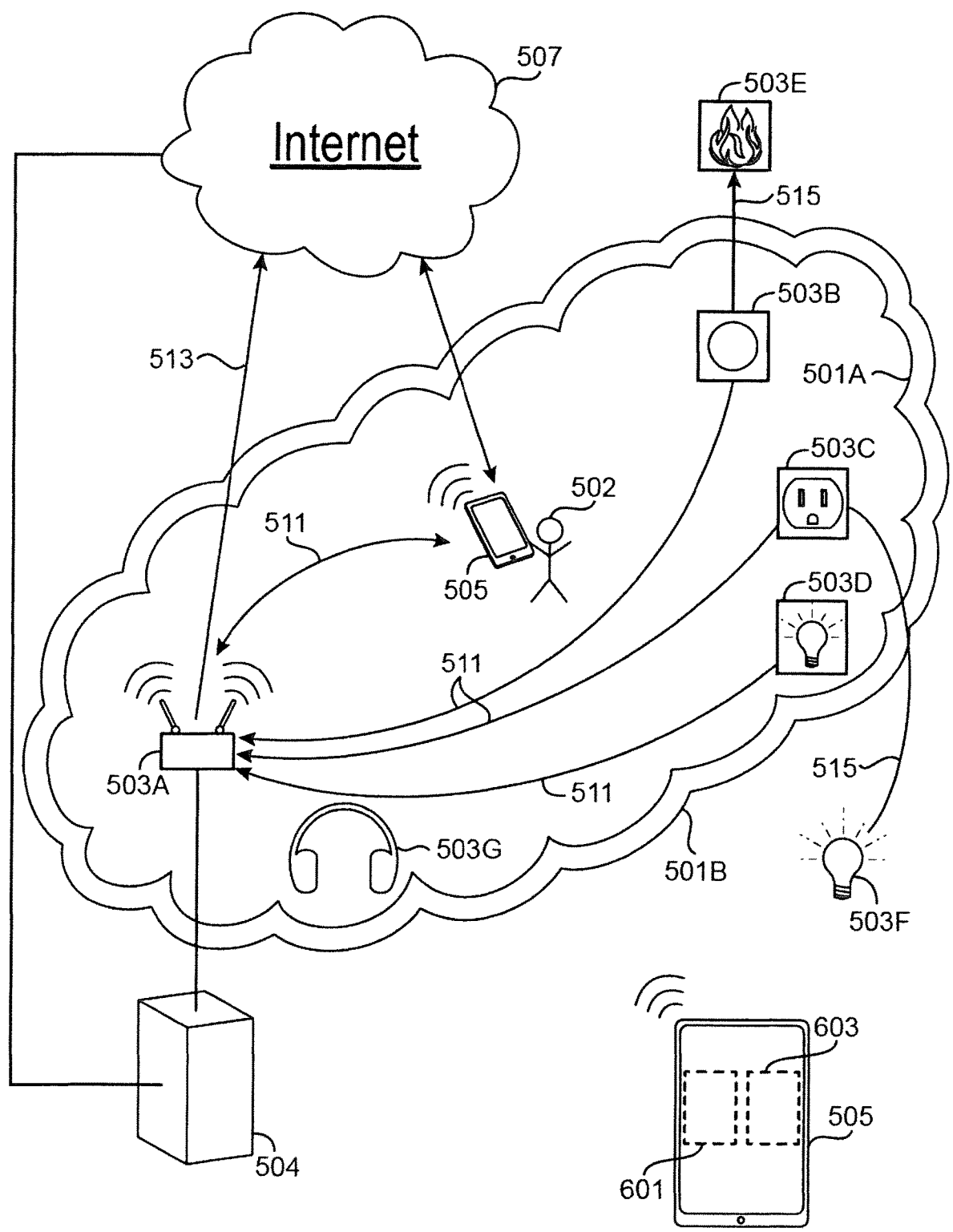
FIG. 5 depicts an alternative embodiment of a system for forming an ad hoc network according to the present disclosure.

FIGS. 4 and 5 depict an embodiment of a system according to the present disclosure before and after the formation of a secondary function network (501B). In FIG. 4, a primary function network (501A) is formed primarily by a wireless router (503A). When a user (502) brings a user device (505) within the range of the primary function network (501A), the user device (505) joins the primary function network (501A), and then form a secondary function network (501B) among certain devices. After the secondary function network (501B) is formed, as shown in the depicted embodiment of FIG. 5, the devices form two generally overlapping networks (501A) and (501B), the first being the primary function network (501A) which provides ordinary network communications, and the second (501B) being a secondary function network (501B) configured to provide NPS and functionality sharing. The secondary network (501B) does not necessarily provide general purpose networking. These and other aspects are described in further detail elsewhere herein.

In the depicted embodiment, a primary function network (501A) is shown formed by a plurality of nodes (503A, 503B, 503C, and 503D). In the depicted embodiment, node (503A) is a wireless router, node (503B) is a smart thermostat, node (505C) is a smart power receptacle, and node (503D) is a smart light controller. The special purpose nodes (503B), (503C) and (503D) communicate (511) directly or indirectly via the router (503A), which also provides Internet connectivity (513). Although FIGS. 4 and 5 depicts nodes in the form of routers, smart thermostats, smart light controllers, and smart power receptacles, it will be understood by a person of ordinary skill in the art that these are exemplary embodiments only, and that in a given embodiment, a node may be any type of device configured for, and/or capable of being configured for, wireless communication as described in this disclosure.

The depicted nodes (503A), (503B), (503C) and (503D), and particularly the depicted smart devices (503B), (503C), and (503D) may in turn be in communication (wired or wireless) (515) with one or more other connected devices. These additional devices may or may not also communicate via the router (503A). By way of example and not limitation, the depicted smart thermostat (503B) directly communicates (515) with a sensor (503E), such as a fire alarm, smoke detector, carbon monoxide detector, radon detector, and the like. Likewise, the depicted smart light controller (503D) directly communicates (515) with one or more smart lights (503F) installed in a light fixture in a structure.

As will be clear to one of ordinary skill in the art, each of the depicted smart devices (503B), (503C), and (503D) is, or may be, developed and manufactured by a different company, resulting in each such device (503B), (503C), and (503D) being designed and configured for wireless communication (515) with other devices in the same device "ecosystem." For example, a smart thermostat (503B) is configured to communicate (515) with sensors (503E) configured to communicate with the smart thermostat (503B). Thus, a consumer who purchases a Google Nest™ smart thermostat will use it with other compatible products configured to work with Google Nest™.

Generally, smart devices (503B), (503C), and (503D), such as those depicted in FIGS. 4 and 5, each communicate over wireless communication protocols defined by a standard, such as a protocol in the IEEE 802.11 or 802.15 families of protocols, known commercially as WiFi, Bluetooth™, and Zigbee™. However, layered on top of these standard protocols are application-specific protocols, which are usually particular to each family or "ecosystem" of related devices. Thus, the depicted smart light (503F), while compatible with the smart light controller (503D), is not necessarily able to be directly controlled or operated by the depicted smart thermostat (503B) or sensor (503E) manufactured by a different company.

Regardless, because all of these devices are capable of transmitting over standard protocols, they can "see" each other within the primary function network (501A), directly or indirectly (e.g., via the router (503A)). Thus, each device is generally discoverable by the other devices merely by the fact that each device is actively transmitting wireless signals via standard protocols, even though not all devices can necessarily be functionally controlled or operated by any other particular device due to the use of proprietary protocols.

Additionally, the network (501A) may include within its range other devices, such as the wireless headphones (503G) depicted in FIGS. 4 and 5, which do not communicate via the wireless router (503A), but are capable of communicating using at least some of the same standard wireless protocols. These devices (503G), whether or not paired to or communicating with any other device, are generally discoverable by other devices within the network (501). For example, if a user (502) enters the network (501A) holding a mobile phone (505), the mobile phone (505) generally will be able to detect the presence of the wireless router (503A), the smart thermostat (503B), the smart power receptacle (503C), the smart light controller (503D), and (if powered on) the wireless headphones (503G). The mobile phone (505) may additionally be able to detect the sensor (503E) and/or the smart light (503F).

The present systems and methods describe techniques and concepts for utilizing some or all of the wireless transmitters embedded in these devices (503A), (503B), (503C), (503D), (503E), (503F) and (503G) (collectively, "devices (503n)") to form and operate a secondary function network (501B), which both facilitates the detection of humans within the physical range of the transmitters in the devices (503n), as well as allows for the aggregation of the various functions of each separate ecosystem into a single, unified system. This network can be formed as a planned network or as an ad hoc network.

By way of example and not limitation, in the depicted embodiment of FIG. 4, if carbon monoxide is detected by sensor (503E), it may be desirable to operate the lights, such as by flashing on and off, to alert occupants that a potentially dangerous condition is present. However, the smart thermostat (503B) may not be able to directly operate the smart light (503F) in response to the sensor (503E) detecting carbon monoxide, because the depicted smart light (503F) is only configured to interact with the controller (503D).

These limitations are overcome using the systems and methods described herein. At a high level, this is done by a first device (such as but not limited to a mobile device (505)), which is configured for establishing a network presence sensing secondary function network (501B), forming a secondary function network (501B) amongst one or more other devices (such as but not limited to one or more of the depicted nodes (503n)). These other devices then in turn may utilize still other devices that they connect to via proprietary protocols in their particular ecosystem. This allows for these other devices to be used in the NPS network (501B) without having to be configured specifically for this purpose.

Once the network of compatible devices for the secondary function network (501B) is discovered, their identities and functionalities can be broadcast or otherwise communicated over the secondary (501B) (or primary (501A)) function network, and these devices then may begin to communicate with each other in either, or both, a primary function network (501A) and/or a secondary function network (501B), as shown in FIG. 5. This may further comprise negotiating the use of the available network resources to facilitate NPS and other primary and/or secondary network functions. Additionally, a central server (504) may be used to manage participating devices, facilitating the aggregation of different functions of differing device ecosystems into a single service tower.

Figure 6:
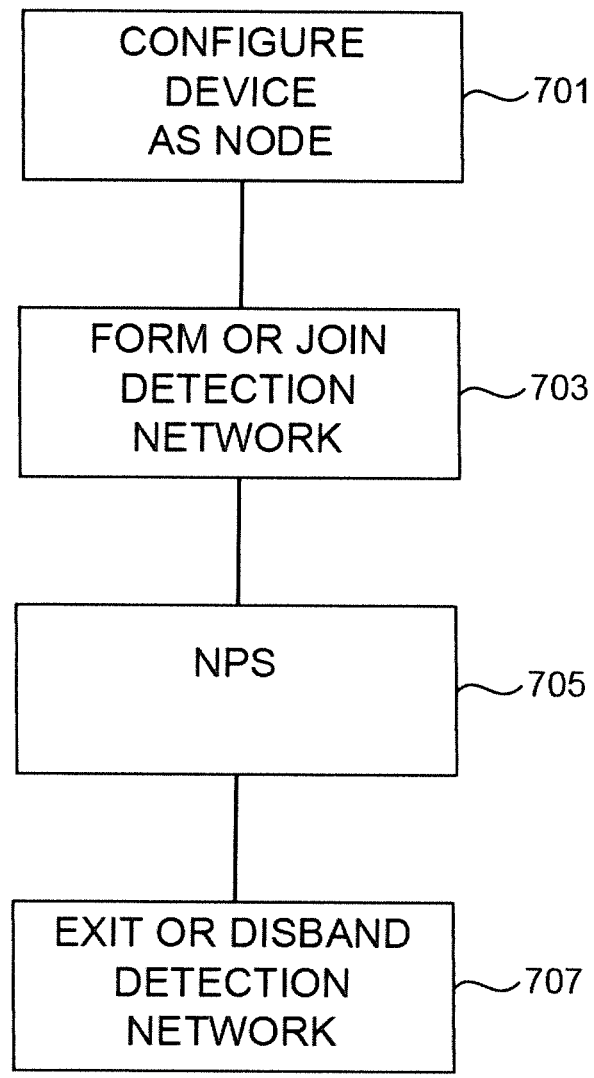
FIG. 6 depicts a flowchart of an embodiment of a method for forming an ad hoc disclosure according to the present disclosure.

An embodiment of a method for forming a secondary function network (501B), such as that depicted in FIG. 5, is depicted in FIG. 6. As such, the method depicted in FIG. 6 is described with respect to the system depicted in FIGS. 4-5. In the depicted embodiment of FIG. 6, an end-user device (505) is configured (701) for use as a node in a detection network (501B). Next, the configured device (505) is used to form or join (703) a detection network (501B). Next, the formed or joined detection network (501B) provides NPS functionality (705). Finally, and optionally, the configured device (505) at some point may exit (707), or the detection network (501B) may be disbanded (707). These steps are described in further detail herein.

There are a number of ways for a device (505) to be configured (701) for use as a node in a detection network (501B). This configuration may include configuring a device (505) with software, or hardware, for discovering other NPS-ready devices (503n) within transmission range of the transmitter in the device (505), and for forming or joining (703) a detection network (501B) comprised of such discovered devices. For example, the device (505) firmware and/or hardware may be modified or appended. Many devices (505), as manufactured, are physically capable of providing device-to-device communication, and produce sufficient network diagnostic data to participate in an NPS detection network (501B) as described herein. For such devices (505), a simple firmware update, or appropriate programming, is sufficient to configure the device (505) for use in an NPS detection network (501B).

For example, the network diagnostic features of the devices (505) wireless communication hardware may not be available to ordinary application software without a firmware update. Alternatively, the device (505) may need to be "jailbroken" to disable certain security or other protective access-limiting features in order to use the network diagnostic data or functionality needed for NPS. For other devices (505), which may lack sufficient inherent functionality to provide the needed network diagnostic data, the wireless hardware in the device (505) may be replaced or supplemented with additional hardware providing the required diagnostic data. FIG. 5 depicts one such device (505) modified by additional hardware (601) and/or additional software (603), as needed.

In step (703), the configured user device (505) forms a secondary function network (501B). There are various techniques for performing this step. By way of example and not limitation, the user device (505), upon entering the physical range of the primary function network (501A), may initiate communications with other discoverable devices (503n) and determine whether any devices (503n) on the primary function network (501A) are configured to communicate in a secondary function network (501B).

There are many techniques for doing so which will be familiar to those of ordinary skill. By way of example and not limitation, the user device (505) may use a proprietary secondary network protocol to query the other devices (503n). Devices (503n) which are configured for NPS on the secondary function network (501B) will be able to understand and respond to the query, whereas other devices will not. The devices (503n) that respond may then form (703) a secondary function network (501B), in which the user device (505) and responsive devices provide NPS functionality in the secondary function network (501B). In the depicted embodiments of FIGS. 4 and 5, one or more of the smart thermostat (503B), smart receptacle (503C), and smart light controller (503D) may be discoverable responsive devices (i.e., be configured to communicate using a secondary function network (501B) providing NPS).

Additionally, each responsive device may in turn operate other devices which may not be discoverable (e.g., not directly part of the primary function network (501A)), and/or which may not be configured to communicate in the secondary function network (501B). In the depicted embodiment, for example, a sensor (503E) is configured to communicate with the smart thermostat (503B) using an application- or ecosystem-specific protocol, but not necessarily to communicate directly via the primary (501A) and/or secondary function networks (501B). The associated responsive device (e.g., the smart thermostat) may then make available via the secondary function network (501B) the features, functions, and capabilities of the non-responsive devices.

Alternatively, the user device (505) may join (703) an existing secondary function network (501B). In a still further embodiment, a third-party service may be used to trigger the activation of the device (505) for use within the secondary function network (501B). As will be understood by one of ordinary skill in the art, the particular implementation of any of these techniques depends upon the network communication protocol used, and the programming of the user device (505) in question, as well as the hardware and firmware of the available devices (503n).

Once the configured device (505) has formed (or joined (703)) the secondary function network (501B), the user device (505) effectively becomes a node (501B) in the network and provides NPS functionality as described in the referenced disclosures above. By way of a simple and non-limiting example, the user device (505) may establish a baseline of wireless network communication characteristics with the devices (503n), or with other user devices (not depicted) within the detection network (501B), and begin to provide NPS functionality by a server (504) observing differences between sets of wireless signal characteristic data (511) provided to the server (504) as described in the references indicated above.

Similarly, the presence of a human, or even a particular user (502), may be inferred, as described in the above-indicated references, via the presence of the device (505). A particular user (502) may be inferred to be present by reference to a user account associated with the user device (505). That is, once the user (502) registers the user device (505) to participate in an NPS system, the presence of the registered user device (505) within a detection network (501B) may be used to infer the presence of the specific user (502) associated with that registration.

Additionally, because the responsive devices are in communication via the secondary function network (501B), these devices may coordinate the sharing of services. For example, in the depicted embodiments of FIGS. 4 and 5, the smart thermostat (503B) may have access to one or more sensors (503E) or other wireless devices (not depicted) which do not communicate over the secondary function network (501B), but which do transmit (515) wirelessly, and thus could be used to provide additional NPS functionality as a node. Additionally, the application-level functionality of these devices may be shared with the secondary function network (501B) via a corresponding responsive device (503B). As described elsewhere herein, by way of example and not limitation, if a sensor (503E) senses a fire or other emergency condition, this may be known by the responsive device (i.e., the smart thermostat (503B)), and that alert or data may be broadcast via the secondary function network (501B). Alternatively, this information may be transmitted via the primary function network (501A), and the secondary function network (501B) may be reserved exclusively for NPS functionality.

Generally, it is preferred that the secondary function network (501B) be used where possible so that in the event that the primary function network (501A) is unavailable, the NPS and functionality sharing nevertheless operate properly. Also by way of example, and not limitation, the responsive devices, such as smart thermostat (503B), smart power receptacle (503C), and the smart light controller (503D), can communicate via a secondary function network protocol to share the services and functions that each separate ecosystem provides.

The process of sharing these functions and data generally comprises repackaging application- or ecosystem-specific data into a generic protocol defined by the designer of the secondary function network (501B). This ensures that all participating responsive devices are able to send and receive information in a way that will be understood by other participating devices. Generally, this results in each participating device having a second network identifier for transmissions using the secondary function network (501B), and the devices may negotiate a protocol for data exchange and network utilization to reduce collisions. The particulars of how the devices negotiate use of the secondary function network (501B) will vary depending upon the nature and needs of each device, as well as the programming of the underlying application- or ecosystem-specific functions. For example, some devices may require that they broadcast application data on a particular frequency. In such cases, those devices negotiate with other devices in the secondary function network (501B) for use of the primary function network (501A), or the secondary function network (501B), or both, at a particular frequency or interval. All other devices will then cooperate collaboratively in the negotiation of the use of the bandwidth to ensure that each device is able to carry out its primary function as well as the secondary function.

In the case where the configured device (505) establishes (703) a secondary function network (501B), the device (505) may then withdraw (707) from the network (501B), and hand off the management and operation function of the secondary function network (501B) to another device. This other device may be another NPS-ready device (503n) but is preferably a centralized server system (504) configured with appropriate software for implementing the functions and operations described herein.

Once the secondary function network (501B) is established, the first device (505) may continue to operate (705) as a node within such a secondary function network (501B), or may be withdrawn (707) from or removed (707) from the network (501B), and the network management functions are performed instead by a server (504). Such a server (504) may be a local server (504) attached through wired or wireless connection directly to the router (503A), or may be a remote server connecting to the router (503A) and controlling the devices (503n) via the Internet (507).

Additionally, in an embodiment, once a secondary function network (501B) is formed, a device generally is assigned as the operator, manager or coordinator of the network. Initially, this may be a user device (505) used to form the secondary function network (501B). However, it is preferred that once the network (501B) is formed, this coordinating function is transferred to another device, preferably a device consistently connected to the network (501B). Because user device (505) is typically a mobile device, such as a smart phone or smart tablet, by its nature it is intended to be carried with the user and will eventually leave the physical transmission range of the network (501B). Thus, it is desirable to transfer this function to a fixed device, such as a server (504), which generally is not removed from the network (501B). As shown in FIGS. 4 and 5, a server (504) may be a part of the network via connection to a wireless router (503A), or via an Internet connection (507). Once the management function is established at the server (504), the user device (505) may depart the network (501B) without impacting the overall operation or coordination of its functions.

It will also be clear to one of ordinary skill in the art that because the various devices (503n) are produced by different manufacturers, and have different hardware components, the transmission and hardware characteristics of each device (503n) will differ. For example, the wireless antenna used in a smart thermostat (503B) is likely to be made by a different manufacturer than the antenna in a smart light controller (503D) or smart power receptacle (503C). Because each antenna will have different power requirements for transmission and receipt of radio signals, the wireless signal characteristic profiles of each may differ significantly. For the proper functioning of the secondary function network (501B), it may be important in certain embodiments that the power and other transmission characteristics of each hardware device be taken into account in performing the NPS functions, so as to improve overall accuracy and effectiveness.

In an alternative embodiment, fixed devices (503n), such as those depicted in FIGS. 4 and 5, are not necessary to form or create a detection network (501B). In the depicted embodiment of FIG. 7, ad hoc detection networks (501B) may be formed by a plurality of user devices (505) communicating (511) directly with each other. In such an embodiment, the NPS functionality is provided directly by the plurality of user devices (505), each of which is functionally a node, similar to the depicted devices (503n) in FIGS. 4 and 5. However, rather than the fixed nodes communicating with a server (504), the user devices (505) communicate (511) directly with each other, as well as communicate (509) with the server (504). This communication with the server (504) may be via a general Internet (507) uplink (509) using wireless Internet technologies as would be understood by one of ordinary skill in the art.

Figure 7:
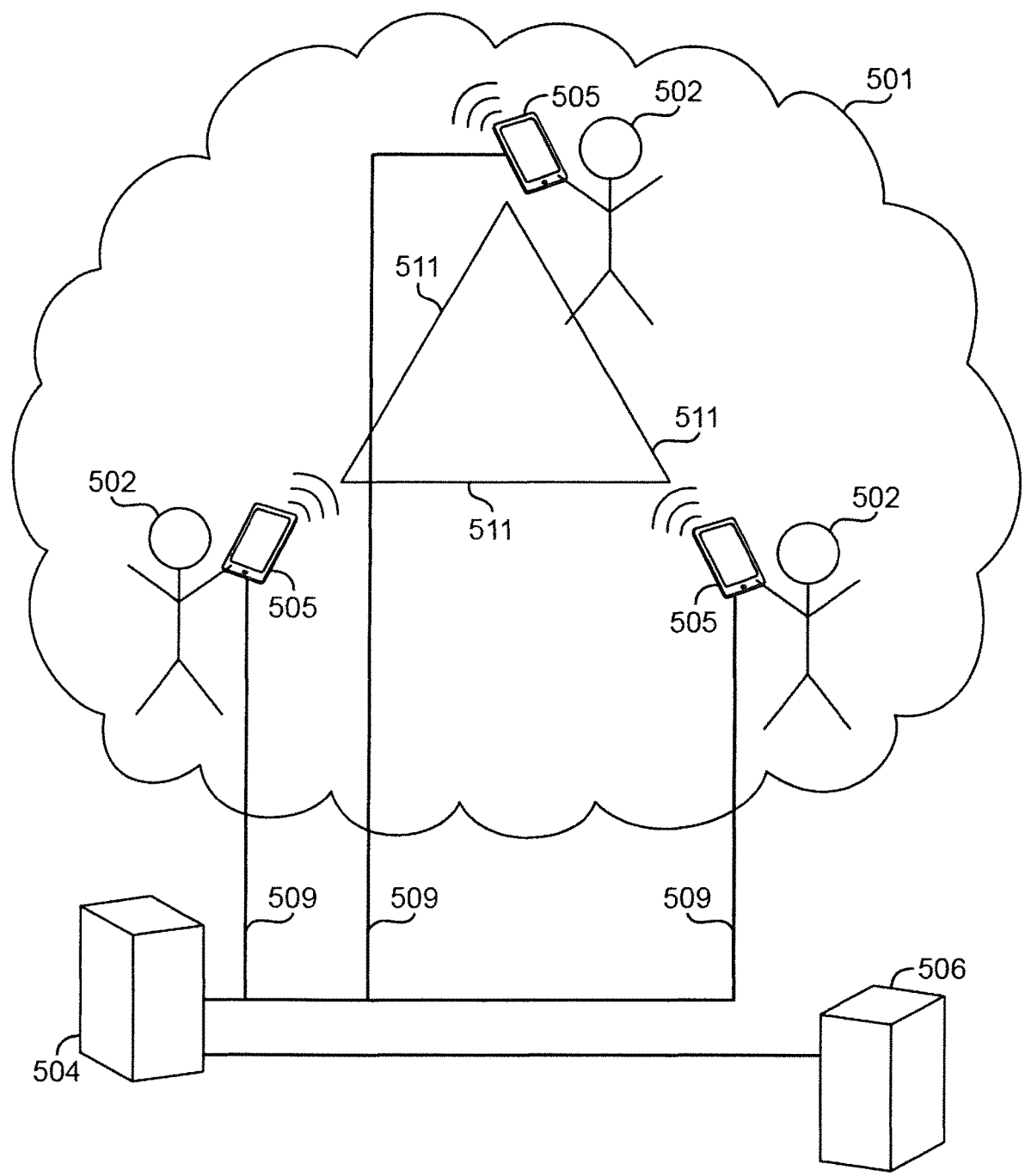
FIG. 7 depicts an alternative embodiment of a system and method for forming an ad hoc network according to the present disclosure.

As with the depicted embodiments of FIGS. 4 and 5, the detection network (501B) may be formed (703) automatically or upon prompting. That is, when at least two devices (505) are within sufficient proximity for direct device-to-device communication, each user may be automatically prompted to join or form a detection network (501B) or the devices (505) may automatically form (703) the network (501B). Similarly, when a third device (505) is within range of an existing ad hoc network (501B), the user (502) may be prompted to join (703) or the device (505) may automatically join (703). The particular behavior depends upon how the specific network is configured to operate, and optionally upon user-provided preferences or configuration choices. An NPS system formed via an ad hoc detection network (501B) as depicted in FIG. 7 otherwise operates under similar principles to those set forth in the indicated references above.

These systems and methods have a number of advantages. First, the need for fixed nodes (503) may be obviated in certain circumstances. Second, the particular configuration or hardware manufacturer of the end user devices (505) is not the deciding factor as to whether a device may participate in the detection network (501). Any number of devices from a multitude of different manufacturers, including devices which are separately configured with different primary function network purposes, may all nevertheless be leveraged in a secondary purpose network to facilitate NPS.

Generally, it is expected that specific programming will be desirable for specific devices due to differences in baseline signal profiles that each device will create, depending upon the specific wireless communication hardware included in such a device. For example, a wireless smartphone manufactured by a given manufacturer, may use a specific wireless communication hardware component, which produces baseline signal profiles that differ significantly from the baseline signal profile generated by a different wireless communication hardware component manufacturer. Thus, it is likely that a single generic firmware update or application programming functionality will not be sufficient to implement NPS, but rather, programming specific to each device will be preferable. It is important to understand that because the NPS functionality is supplemental to the primary network function of the device, the systems and methods described herein allow user devices (505) to simultaneously function according to their original design in primary networks, as well as in secondary networks as NPS nodes. That is, NPS-enabled devices would be able to recognize one another as being enabled via the hardware, firmware, or other software updates, allowing users to create ad hoc detection networks, which then enable the NPS functionality described in the above-indicated references.

By way of an illustrative, non-limiting example, suppose a plurality of users enter a concert hall with NPS-enabled (701) devices. The devices (505) may then form an ad hoc detection network (501B) and begin to provide NPS functionality. If the manager of the facility is subscribed or otherwise participates in an NPS-enabled facilities management platform or system, the detection inputs from the ad hoc network (501B) may be provided to the facility systems to automatically operate them to accommodate the crowd. For example, the collection of devices (505) in the concert hall may estimate a number of people present, and provide that information to a facilities automation system, or HVAC system, which may then adjust temperature settings to accommodate the size of the crowd. As more people arrive, the devices (505) continue to update the facilities system with an estimate of the number of people present, allowing for real time adjustments to the temperature settings to prevent the facility from becoming uncomfortably hot. Further, as more people arrive, it is likely that more NPS-enabled devices (505) will join the network (501B), which will tend to increase the accuracy of the estimates. An embodiment of a facilities management server is depicted in FIG. 7 as element (506).

Because the "ecosystem" of NPS-enabled devices can be built across multiple differing manufacturers and products, a secondary market in NPS-enabled applications may emerge.

For example, in the facilities example involving a concert hall described elsewhere herein, each of the individual users bringing an NPS-enabled device (505) into the concert hall has a primary network function "ecosystem" with the wireless service provider for each individual user's phone. That is, each user has independently selected the specific end-user device (505) that the user desires, and the specific wireless carrier that the user prefers, independently of any considerations pertaining to NPS. A secondary subscription may apply to NPS services for participating users, independently of the primary wireless carrier subscription. In an embodiment, users may be incentivized to participate in NPS by receiving a royalty, a stipend, or other payment or micropayment in connection with configuring the user device to participate in the network. Such users would participate in a network primarily as data providers, not data consumers. Subscription fees for access to the NPS-enabled secondary function network would be paid by subscribers or consumers of the resulting data. For example, the end users entering the concert hall may receive a small stipend or micropayment for participating in the detection network, and the concert hall building manager will pay a subscription fee for access to the resulting data, and use of that data to control facilities automation systems. The separability of charging and billing of the primary network framework of each device from the secondary network framework facilitates a clear separation between the individual device functionality and the extended functionality of a cooperating system of NPS-enabled devices.

Additionally, or alternatively, the systems and methods described herein may be used to create a system wherein the NPS-enabled devices form a single network for joint operation. In such embodiment, the participating devices recognize the presence of the NPS-enabled other devices and form a single wireless communication network for the purpose of NPS functionality. This single communication network facilitates the coordination of primary network function communication, while still facilitating collaboration for purposes of network present sensing in a secondary network function.

In a further embodiment, applications may be programmed or developed to operate within the secondary network function system. In such an embodiment, the presence of a detection network (501B) and the participating devices (505) would provide access to a basic set of data and functionality in any instance in which a network (501B) may be detected or formed (703). In such an embodiment, the devices are standardized on a common hardware and/or firmware standard, ensuring that all participating devices have similar baseline profile characteristics, and that all participating devices provide ongoing network diagnostic information in connection with the detection network (501B). Because all such participating devices are standardized on a hardware and/or firmware standard, the hardware and/or firmware standard may be configured to provide enhanced functionality to further improve the operation and accuracy of the NPS system. Further, by standardizing the hardware and/or firmware, integration of these features with application software may be simplified. As a standard, APIs or SDKs may be utilized to provide uniform access to the network present sensing functionality of the participating devices (505).

The systems and methods described herein may be used to implement any of the NPS technologies described in the above-indicated references, including, without limitation, change detection (detecting changes in position of one or more humans within a detection area), presence detection (occupancy sensing within a detection area), counting (estimating the number of humans present in a detection area), locating (locating specific individuals within a detection area), and the like. This further includes operating third-party systems at varying performance levels according to the particular application implementation. Other features may also be implemented, including, without limitation, a creation of maps of the relative locations of nodes, and learning which nodes form detection networks. The detection networks may further be associated with given actions by learning which actions are taken by end users when detection networks are formed. As described in the above-indicated references, this facilitates automatic development of relationships among devices (505) and events for a given detection network.

The present systems and methods extend the capability of NPS to operate across the commercial boundaries of different manufacturers and wireless carriers, as well as device-specific product ecosystems. This allows different devices to collaborate in a generation of network diagnostic information, regardless of whether the disparate manufacturers of the devices design the devices to operate in this fashion. This in turn may lead to the development of secondary product ecosystems, which provide NPS functionality and enable a larger number of devices to participate in the formation or creation of detection networks. This in turn improves the usefulness and accuracy of NPS technology, further developing the functionality of NPS networks. The systems and methods also facilitate simpler integration of NPS technology across commercial boundaries, further enhancing the benefits derived from NPS functionality.

While the invention has been disclosed in conjunction with a description of certain embodiments, including those that are currently believed to be preferred embodiments, the detailed description is intended to be illustrative and should not be understood to limit the scope of the present disclosure. As would be understood by one of ordinary skill in the art, embodiments other than those described in detail herein are encompassed by the present invention. Modifications and variations of the described embodiments may be made without departing from the spirit and scope of the invention.

The invention claimed is:

1. A method for sharing device functionality comprising:
providing a first wireless network device communicating via a first wireless network configured for telecommunication;
providing a second wireless network device communicating via a second wireless network configured for telecommunication;
providing a user device entering a geographic range of said first wireless network and discovering said first wireless network device and said second wireless network device;
said user device forming a third wireless network with said first wireless network device and said second wireless network device, said third wireless network indicating a presence of humans proximate to said first wireless network based on interference of humans with wireless network signals emitted by said first wireless network device and said third wireless network indicating a presence of humans proximate to said second wireless network based on interference of humans with wireless network signals emitted by said second wireless network device.

2. The method of claim 1, further comprising said first wireless network device making available to said second wireless network device via said third wireless network at least one proprietary function of said first wireless network device.

\* \* \* \* \*